(12) United States Patent
Davids et al.

(10) Patent No.: US 8,452,134 B1
(45) Date of Patent: May 28, 2013

(54) FREQUENCY SELECTIVE INFRARED SENSORS

(75) Inventors: Paul Davids, Albuquerque, NM (US); David W. Peters, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 311 days.

(21) Appl. No.: 12/871,334

(22) Filed: Aug. 30, 2010

(51) Int. Cl.
*G02B 6/00* (2006.01)

(52) U.S. Cl.
USPC .......................................................... 385/12

(58) Field of Classification Search
None
See application file for complete search history.

(56) References Cited

U.S. PATENT DOCUMENTS

| | | |
|---|---|---|
| 7,329,871 B2 | 2/2008 | Fan et al. |
| 7,352,468 B2 | 4/2008 | Tarsa |
| 7,531,805 B1 | 5/2009 | Gregoire et al. |
| 2011/0156189 A1* | 6/2011 | Gravrand et al. ............. 257/432 |

OTHER PUBLICATIONS

LePerchec et al., "Plasmon-based photosensors comprising a very thin semiconducting region", May 7, 2009, Applied Physics Letters, 94, 181104.*
A. A. Cruz-Cabrera, et al., Fabrication and Testing of Plasmonic Optimized Transmission and Reflection Coatings, Advanced Fabrication Technologies for Micro/Nano Optics and Photonics. Edited by Suleski, Thomas J.; Schoenfeld, Winston V.; Wang, Jian Jim. Proceedings of the SPIE, vol. 6883, pp. 68830R-68830R-8 (2008).
D. W. Peters, et al., Plasmonic Antireflection Surfaces for the Mid-Infrared, Photonic Crystal Materials and Devices VI. Edited by Adibi, Ali; Lin, Shawn-Yu; Scherer, Axel. Proceedings of the SPIE, vol. 6480, pp. 64800A (2007).
P. S. Davids, et al., Plasmonic Integrated Optics: Going the Last Few Microns, Presented Jul. 20, 2010 at SUM 2010 IEEE Photonics Society Summer Topicals Meeting on Novel Waveguiding, Structures and Phenomena, Playa del Carmen, Riviera Maya, Mexico.
David W. Peters, et al., Transmissive Infrared Frequency Selective Surfaces and Infrared Antennas: Final Report for LDRD 105749, Sandia National Laboratories Report No. SAND2009-6012, Sep. 2009.
David W. Peters, et al., Metamaterial-Inspired High-Absorption Surfaces for Thermal Infrared Applications, Proceedings of the SPIE, vol. 7609, pp. 76091C-1-76091C-7, 2010.
David W. Peters, et al., All-Angle Polarization-Insensitive Infrared Absorbers for Detector Applications, presented at the NATO Advanced Research Workshop, META'10, International Conference on Metamaterials, Photonic Crystals, Cairo, Egypt, Feb. 22, 2010.

* cited by examiner

*Primary Examiner* — Sung Pak
(74) *Attorney, Agent, or Firm* — Martin I. Finston

(57) ABSTRACT

A frequency selective infrared (IR) photodetector having a predetermined frequency band. The exemplary frequency selective photodetector includes: a dielectric IR absorber having a first surface and a second surface substantially parallel to the first surface; an electrode electrically coupled to the first surface of the dielectric IR absorber; and a frequency selective surface plasmonic (FSSP) structure formed on the second surface of the dielectric IR absorber. The FSSP structure is designed to selectively transmit radiation in the predetermined frequency band that is incident on the FSSP structure substantially independent of the angle of incidence of the incident radiation on the FSSP structure.

15 Claims, 7 Drawing Sheets

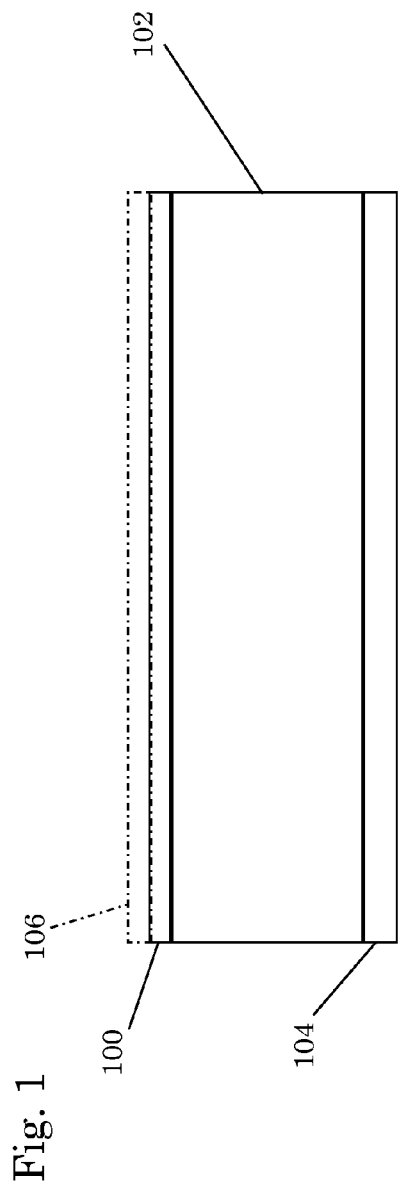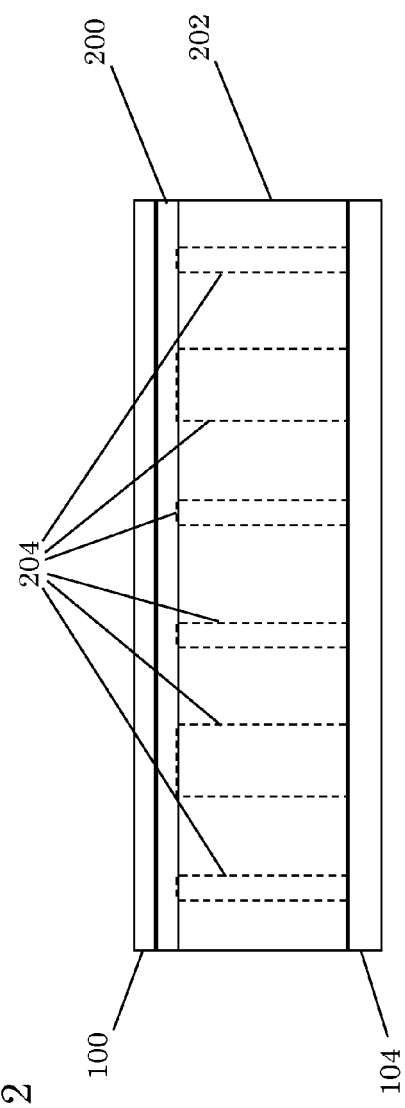

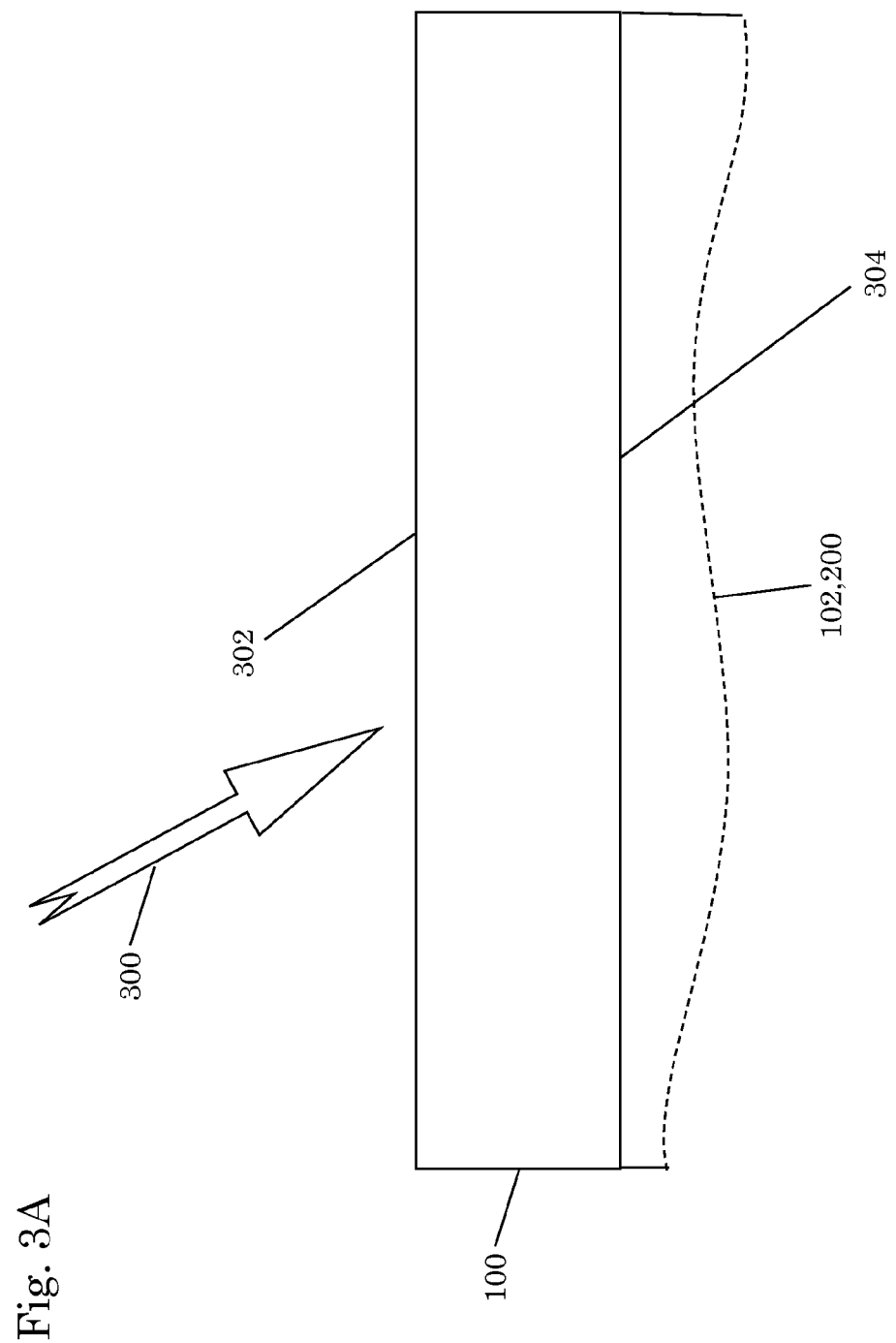

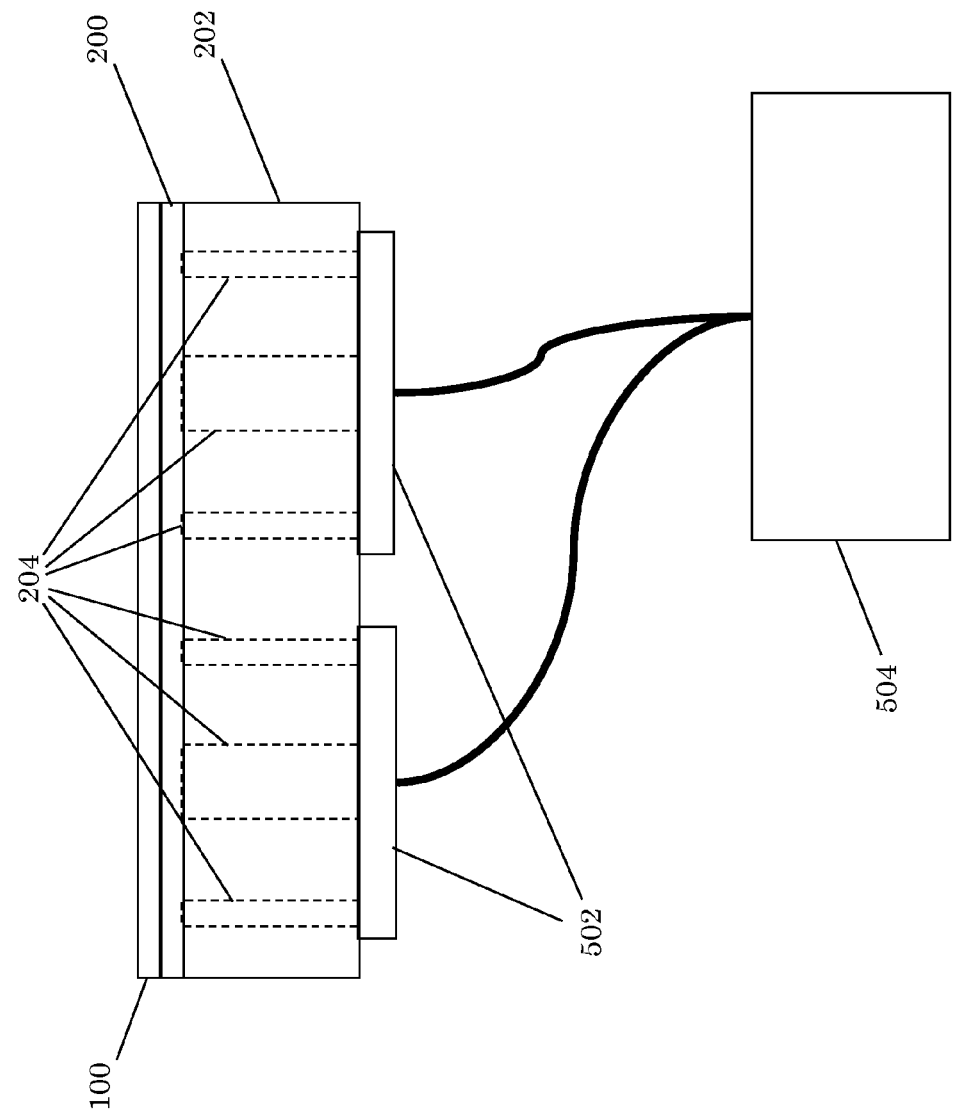

FREQUENCY SELECTIVE INFRARED SENSORS

This invention was developed under Contract DE-AC04-94AL8500 between Sandia Corporation and the U.S. Department of Energy. The U.S. Government has certain rights in this invention.

TECHNICAL FIELD

The present invention is directed generally to frequency selective infrared (IR) sensors and focal plane arrays (FPAs), and, more particularly, to frequency selective IR sensors and FPAs that include a frequency selective surface plasmonic (FSSP) structure.

BACKGROUND OF THE INVENTION

The infrared (IR) spectral region is of interest for a number of reasons. For example, the frequency peak of the blackbody radiation spectrum at room temperature is at ~30 THz. Thus, at typical ambient temperatures objects continually exchange energy with the radiation field at IR frequencies. Therefore, there is significant information about properties such as the temperature, emissivity, etc. of objects in our environment contained in the IR radiation field.

At night, this radiation may be used to visualize the environment and to find particularly "hot" objects—such as, for example, people and engines. This application has made the IR spectral region important for defense applications, leading the military to have had a long-standing focus on improving infrared technology.

Additionally, the atmosphere is somewhat transparent in two different IR spectral windows (MWIR: mid-wave IR ~60-100 THz, and LWIR: long-wave IR ~25-40 THz), making these ranges particularly interesting.

Furthermore, many common molecular vibrations are in the IR, e.g., the vibrational mode of a hydrogen molecule is ~120 THz and the C-H stretch vibration (of interest because most organic compounds have a signature in this frequency range) is ~90 THz, while heavier and more complex molecules have signatures at lower frequencies. For example the P-O stretch, that is a signature of many nerve agents, is ~30 THz.

Therefore, there is, and will continue to be, significant interest in detecting and monitoring radiation across the IR spectral range and new methods and sensors for performing these functions are continually sought. Exemplary embodiments of the present invention include frequency selective IR photodetectors, rectennas, focal plane arrays, and waveguide sensors to help meet the demand for various forms of frequency selective IR sensors.

SUMMARY OF THE INVENTION

An exemplary embodiment of the present invention is a frequency selective infrared (IR) photodetector having a predetermined frequency band. The frequency selective photodetector including: a dielectric IR absorber having a first surface and a second surface substantially parallel to the first surface; an electrode electrically coupled to the first surface of the dielectric IR absorber; and a frequency selective surface plasmonic (FSSP) structure formed on the second surface of the dielectric IR absorber. The FSSP structure is designed to selectively transmit radiation in the predetermined frequency band that is incident on the FSSP structure substantially independent of the angle of incidence of the incident radiation on the FSSP structure.

Another exemplary embodiment of the present invention is a frequency selective IR rectenna having a predetermined frequency band. The exemplary frequency selective IR rectenna includes: an FSSP structure having a first surface and a second surface substantially parallel to the first surface; an electrically insulating thin film layer coupled to the second surface of the FSSP structure; an electrically insulating via layer coupled to the electrically insulating thin film layer opposite from the FSSP structure; via conductors formed in vias in the electrically insulating via layer; and an electrode electrically coupled to the via conductors. The FSSP structure is designed to selectively convert radiation in the predetermined frequency band that is incident on the FSSP structure into surface plasmon waves (SPWs) substantially independent of the angle of incidence of the incident radiation on the FSSP structure, and has a design SPW resonance for SPWs propagating on the second surface of the FSSP structure approximately equal to the highest frequency of the predetermined frequency band. The electrically insulating via layer includes multiple vias running approximately perpendicular to the second surface of the FSSP structure. Each via is positioned to correspond to a peak of the SPW standing wave pattern formed by SPWs at the design SPW resonance propagating on the second surface of the FSSP structure.

A further exemplary embodiment of the present invention is a frequency selective infrared focal plane array (IRFPA) having a predetermined frequency band. The frequency selective IRFPA includes: a dielectric IR absorber having a first surface and a second surface substantially parallel to the first surface; an FSSP structure formed on the first surface of the dielectric IR absorber; an N×M array of electrodes electrically coupled to the second surface of the dielectric IR absorber; and an image decoding processor coupled to the electrodes. The FSSP structure is designed to selectively transmit radiation in the predetermined frequency band that is incident on the FSSP structure substantially independent of the angle of incidence of the incident radiation on the FSSP structure. The image decoding processor designed to generate image data from electrical signals transmitted by the electrodes.

An additional exemplary embodiment of the present invention is a frequency selective IRFPA having a predetermined frequency band. The frequency selective IRFPA includes: an FSSP structure having a first surface and a second surface substantially parallel to the first surface; an electrically insulating thin film layer coupled to the second surface of the FSSP structure; an electrically insulating via layer coupled to the electrically insulating thin film layer opposite from the FSSP structure; multiple via conductors formed in vias in the electrically insulating via layer; a number of electrodes electrically coupled to the via conductors; an image decoding processor coupled to the electrodes. The FSSP structure designed to selectively convert radiation in the predetermined frequency band that is incident on the FSSP structure into SPWs substantially independent of the angle of incidence of the incident radiation on the FSSP structure. The electrically insulating via layer includes vias running approximately perpendicular to the second surface of the FSSP structure. Each via is positioned to correspond to a peak of the SPW standing wave pattern formed by SPWs propagating on the second surface of the FSSP structure. Each of the electrodes is electrically coupled to an N×M pixel array of the via conductors, where N and M are positive integers. The image decoding processor is designed to generate image data from electrical signals transmitted by the electrodes.

A still further exemplary embodiment of the present invention is a frequency selective IR waveguide sensor having a predetermined frequency band. The frequency selective IR waveguide sensor includes: a waveguide core; a cladding layer having an outer surface and coupled to the waveguide core; an FSSP structure having a first surface with a transfer portion coupled to the outer surface of the cladding layer; and a second surface substantially parallel to the first surface; a dielectric thin film layer having a third surface coupled to a coupling surface of the FSSP structure and a fourth surface substantially parallel to the third surface; and an electrode electrically coupled to the fourth surface of the dielectric thin film layer. The FSSP is designed to selectively couple radiation in the predetermined frequency band from an evanescent mode of the waveguide core into a design SPW resonance for SPWs propagating on the coupling surface of the FSSP structure, the coupling surface being one of the first surface or the second surface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 is a side plan drawing of an exemplary frequency selective infrared (IR) photodetector according to the present invention;

FIG. 2 is a side plan drawing of an exemplary frequency selective IR rectenna according to the present invention;

FIG. 3A is a side plan drawing illustrating incident IR incident on the exemplary frequency selective surface (FSS) of the exemplary embodiments of FIGS. 1 and 2;

FIG. 6 is a schematic side plan drawing of an alternative exemplary frequency selective IRFPA according to the present invention.

DETAILED DESCRIPTION OF THE INVENTION

Figure 3C:
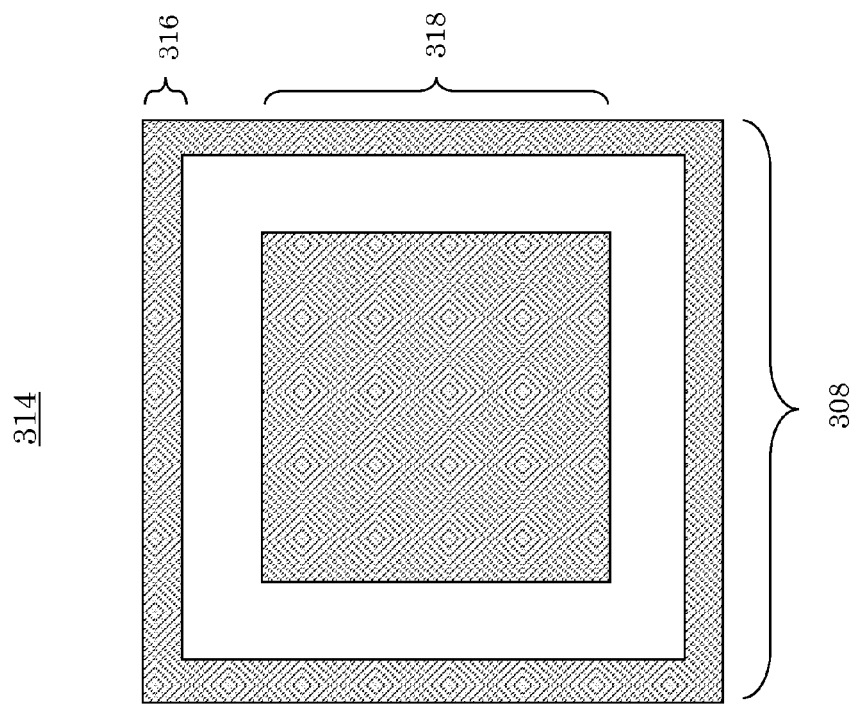
FIGS. 3B and 3C are top plan drawings of two different exemplary unit cells that may be tiled to form the exemplary FSS of FIG. 3A.

Exemplary embodiments of the present invention include frequency selective infrared (IR) photodetectors, focal plane arrays, and waveguide sensors that incorporate a frequency selective surface (FSS) based on surface plasmon wave (SPW) resonance.

Plasmonic structures open up new opportunities in photonic devices, sometimes offering an alternate method to perform a function and sometimes offering capabilities not possible with standard optics. For example, exemplary FSSs of the present invention are metal (metal-like) coatings on optical surfaces that do not substantially adversely affect the transmission of those surfaces in the design frequency band. This technology may be applied as an RF noise-blocking layer across an optical aperture or as a method to apply an electric field to an active electro-optic device without affecting optical performance.

These exemplary IR optical antennas may be used in exemplary photodetectors. Furthermore, in other exemplary embodiments of the present invention, these structures may be electrically coupled with other components to provide direct rectification of IR radiation, which may lead to new methods of IR detection and energy harvesting of IR radiation.

FIG. 1 illustrates an exemplary frequency selective IR photodetector, according to the present invention. This exemplary frequency selective IR photodetector has a predetermined frequency band, which may desirably be in the range of about 20 THz to about 40 THz. The exemplary frequency selective IR photodetector of FIG. 1 includes: dielectric IR absorber 102; frequency selective surface plasmonic (FSSP) structure 100 formed on the second surface of the dielectric IR absorber 102; and electrode 104 which is electrically coupled to the surface of dielectric IR absorber 102 opposite from FSSP structure 100. This exemplary frequency selective IR photodetector may also include wavelength selective thin film reflector layer 106 formed on the outer surface of FSSP structure 100.

Dielectric IR absorber 102 may be formed of any dielectric absorber material that efficiently absorbs IR radiation in the desired frequency band of the exemplary frequency selective IR photodetector. The use of common dielectric IR absorber materials such as: group IV semiconductor materials (e.g. Si or Ge); II/VI or II/VII semiconductor materials (e.g. HlgCdTe); or III/V semiconductor materials (e.g. GaAs), may be desirable to allow manufacture of the exemplary device to use established techniques; however, other material such as, e.g. organic semiconductors, may be used as well.

It may be desirable for dielectric IR absorber 102 to be approximately a quarter-wave thick for IR radiation at the peak frequency of the desired frequency band to provide adequate absorption of incident IR radiation, i.e.:

$$t_{absorber} = c/4n_{ave}f_{peak} \qquad \text{Equation 1,}$$

where: $t_{absorber}$ is the thickness of dielectric IR absorber 102; c is the speed of light in vacuum; $n_{ave}$ is the average index of refraction of dielectric IR absorber 102; and $f_{peak}$ is a peak frequency of the predetermined frequency band. Additionally, electrode 104 may desirably be reflective to radiation in the desired frequency band.

Dielectric IR absorber 102 is desirably fabricated to include a traditional photodetector structure. Such structures include: bulk photoconductor structures (N-type or P-type); P-N photodiode structures; P-I-N photodiode structures; and multiple quantum well detector structures. A wavelength selective thin film reflector layer may also be formed as part of dielectric IR absorber 102, desirably adjacent to the surface on which FSSP structure 100 is formed.

FSSP structure 100 is designed to selectively transmit radiation in the predetermined frequency band that is incident on the FSSP structure substantially independent of the angle of incidence of the incident radiation on the FSSP structure.

Frequency selective surface structures have been used at microwave frequencies; however, these structures have not been used previously in IR systems. Exemplary embodiments of the present invention include FSSP structures specifically designed to operate in the IR band. These exemplary FSSP structures allow a patterned conductive layer (PCL) to be added to a surface without substantially increasing reflection at the design frequency or significantly affecting the transmission of the surface. This ability functions over a broad angular range from normal to near grazing incidence. These structures involve SPWs, whose properties may be exploited for a number of unique applications, such as those exploited in the various exemplary embodiments of the present invention.

For, example, such an exemplary structure may be designed to block electrical noise without affecting the performance of an exemplary optical device at the design frequency band of the FSSP structure. This treatment of the surface may be compatible with other surface treatments such as multi layer dielectric anti reflection coatings and, thus, may be used in conjunction with them. This type of FSSP structure may also be used as the electrical contacts directly on top of an electro-optic device while not blocking the optical signal of interest. Additionally, unlike many surface treatments (such as multilayer dielectric reflectors), this exemplary FSSP structure is remarkably angularly independent.

FSSP structure 100 includes a connected conductive layer with a periodic array of apertures. This patterned conductor layer (PCL) may be formed of any material capable of supporting SPWs without excessive dissipation, such as, e.g.: gold; aluminum; copper; silver; platinum; titanium; tungsten; an alloy or combination thereof; high temperature superconductors; or metal superconductors. It is desirable for the PCL to be thick enough that very little of the energy of the incident IR radiation may be directly transmitted through the PCL without the intermediary of being coupled into SPW modes of the PCL, but not so thick as to substantially affect transmission of the energy of the incident IR radiation in the desired frequency band through the PCL indirectly using the intermediary of the SPW modes of the PCL. As may be understood by one skilled in the art, the desired thickness of this PCL may be determined based on a number of factors of the specific FSSP structure desired, such as: the electrical properties on the PCL material; the desired frequency band; and which surface(s) of the FSSP structure the resonant SPWs are intended to propagate on.

FSSP structure 100 may also include an adhesion layer between dielectric IR absorber 102 and the PCL. This adhesion layer may be patterned as well, although this is not necessary. Additionally, FSSP structure 100 may further includes insulating material filling gaps in the PCL. This insulating material, which may be composed of a dielectric material similar to the dielectric material of dielectric IR absorber 102, may be particularly desirable if wavelength selective thin film reflector layer 106, or another optional structure is to be formed on the outer surface of FSSP structure 100.

As illustrated in FIG. 3A, IR radiation 300 may generate resonant SPWs on one or both of outer surface 302 and/or inner surface 304 of FSSP structure 100, which is in contact with dielectric absorber 102 in the exemplary embodiment of FIG. 1 (or thin film insulating layer 200, as described below with respect to the exemplary embodiment of FIG. 2).

The periodic array of apertures forming the PCL of FSSP structure 100, includes a two dimensional array of substantially identical square unit cells, each unit cell having a side length, $l_{unit}$, such that $$l_{unit} < c/2nf_{peak}$$ Equation 2, where: c is the speed of light in vacuum; n is the index of refraction of the dielectric IR absorber 102 at surface 304; and $f_{peak}$ is a peak frequency of the desired frequency band. Thus, the PCL of FSSP structure 100 desirably has a design SPW resonance that is approximately equal to the peak frequency of the predetermined frequency band of the exemplary frequency selective IR photodetector. It is noted that Equation 2 also illustrates that the features of the PCL have subwavelength dimensions. Therefore, the effects of FSSP structure 100 on steady-state IR radiation do not include diffraction effects.

Additionally, it is noted that it may be desirable for the IR absorbing material of dielectric IR absorber 102 to have a bandgap energy approximately equal to the photon energy of IR radiation having a lowest frequency of the predetermined frequency band. In this way, FSSP structure 100 may act as a low pass filter and dielectric IR absorber 102 may act as a high pass filter to define the desired frequency band of the exemplary frequency selective IR photodetector of FIG. 1.

It is contemplated that FSSP structure 100 may be multilayer including multiple PCLs with intervening layers of dielectric. However, as discussed above, IR FSSP structures offer challenges not encountered in the microwave regime. For example, due to increased metal loss in this frequency band, there may be a trade-off between possible improved frequency selectivity gained by having multiple PCLs with intervening layers of dielectric and potential signal loss associated with each PCL.

Figure 3B:
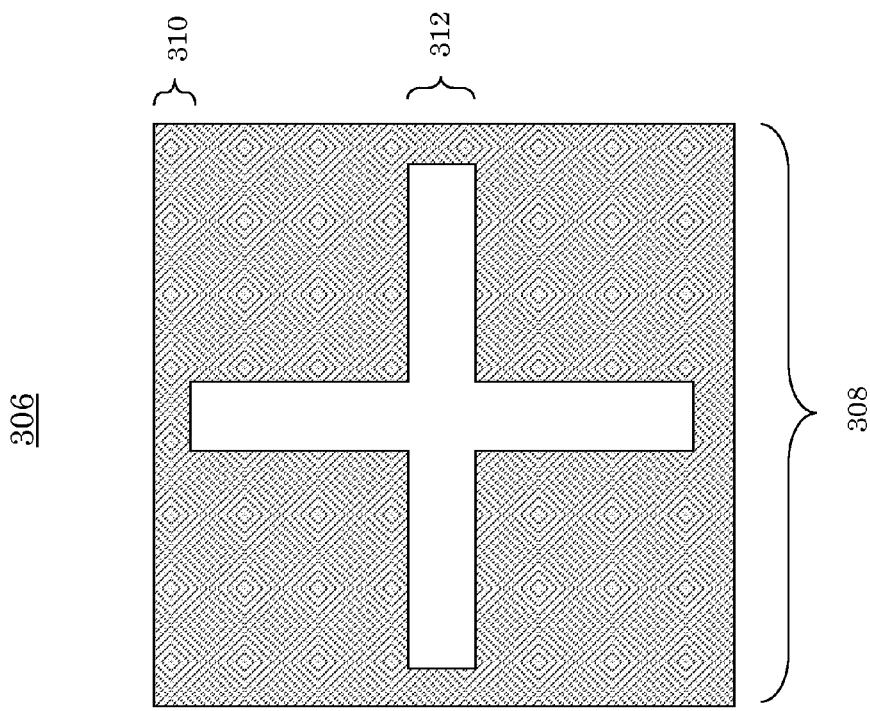

FIGS. 3B and 3C illustrate two exemplary unit cell designs for PCLs in exemplary FSSP structure 100. These two unit cell designs are intended as merely exemplary and are not intended to be limiting. FIG. 3B illustrates cruciform unit cell pattern 306. This unit cell design includes three dimensions that may be varied to affect the spectrum of resonant SPWs on a PCL formed of an array of cruciform unit cells. One convenient basis of these dimensions is illustrated in FIG. 3B: cell side length 308; separation distance 310; and cross thickness 312.

FIG. 3C illustrates square loop unit cell pattern 314. This unit cell design also includes three dimensions that may be varied to affect the spectrum of resonant SPWs on a PCL formed of an array of square loop unit cells. One convenient basis of these dimensions is illustrated in FIG. 3C: cell side length 308; mullion width 316, and middle square side length 318.

FIG. 2 illustrates another embodiment of the present invention, an exemplary frequency selective IR rectenna, which has a predetermined frequency band in the IR band, desirably is in the range of about 160 THz to about 400 THz.

This exemplary frequency selective IR rectenna includes: FSSP structure 100; electrically insulating thin film layer 200, which is coupled to FSSP structure 100; electrically insulating via layer 202, which is coupled to electrically insulating thin film layer 200; via conductors 204, which are formed in vias through electrically insulating via layer 202; and electrode 104, which is electrically coupled to via conductors 204.

In the exemplary frequency selective IR rectenna of FIG. 2, FSSP structure 100 is substantially similar to the FSSP structure of the exemplary frequency selective IR photodetector of FIG. 1, and is designed to selectively convert incident radiation in the predetermined frequency-band into SPWs on a surface of FSSP structure 100 substantially independent of the angle of incidence of the incident radiation on the FSSP structure. As described above with respect to exemplary frequency selective IR photodetectors of FIG. 1, it is contemplated that multilayer FSSP structures include multiple PCLs, adhesion layers, and/or thin film dielectric reflectors 106 may be used in exemplary frequency selective IR rectenna of FIG. 2.

In the exemplary frequency selective IR rectenna of FIG. 2, the oscillating electric field intensities of the SPWs propagating on surface 304 of FSSP structure 100 are coupled to via conductors 204 across electrically insulating thin film layer 200. The PCL of FSSP structure 100 desirably has a design SPW resonance for SPWs propagating on inner surface 304 (illustrated in FIG. 3A) that is approximately equal to a highest frequency of the desired frequency band. As in the exemplary frequency selective IR photodetector of FIG. 1, this design SPW resonance may desirably be achieved in the exemplary frequency selective IR rectenna of FIG. 2 using a PCL that is formed of an array of substantially identical square unit cells. If FSSP structure 100 and via conductors 204 are formed of materials with differing work functions, FSSP structure 100, electrically insulating thin film layer 200, and each via conductor 204 may function as an M-I-M diode structure, effectively rectifying the IR signal to provide a unidirectional electric current to be emitted from the exemplary frequency selective IR rectenna. It is noted that it may also be desirable for electrode 104 to be formed of the same material as via conductors 204. In addition to functioning as an IR detector, this exemplary design may provide an efficient method for harvesting energy from IR radiation sources.

Figure 4:
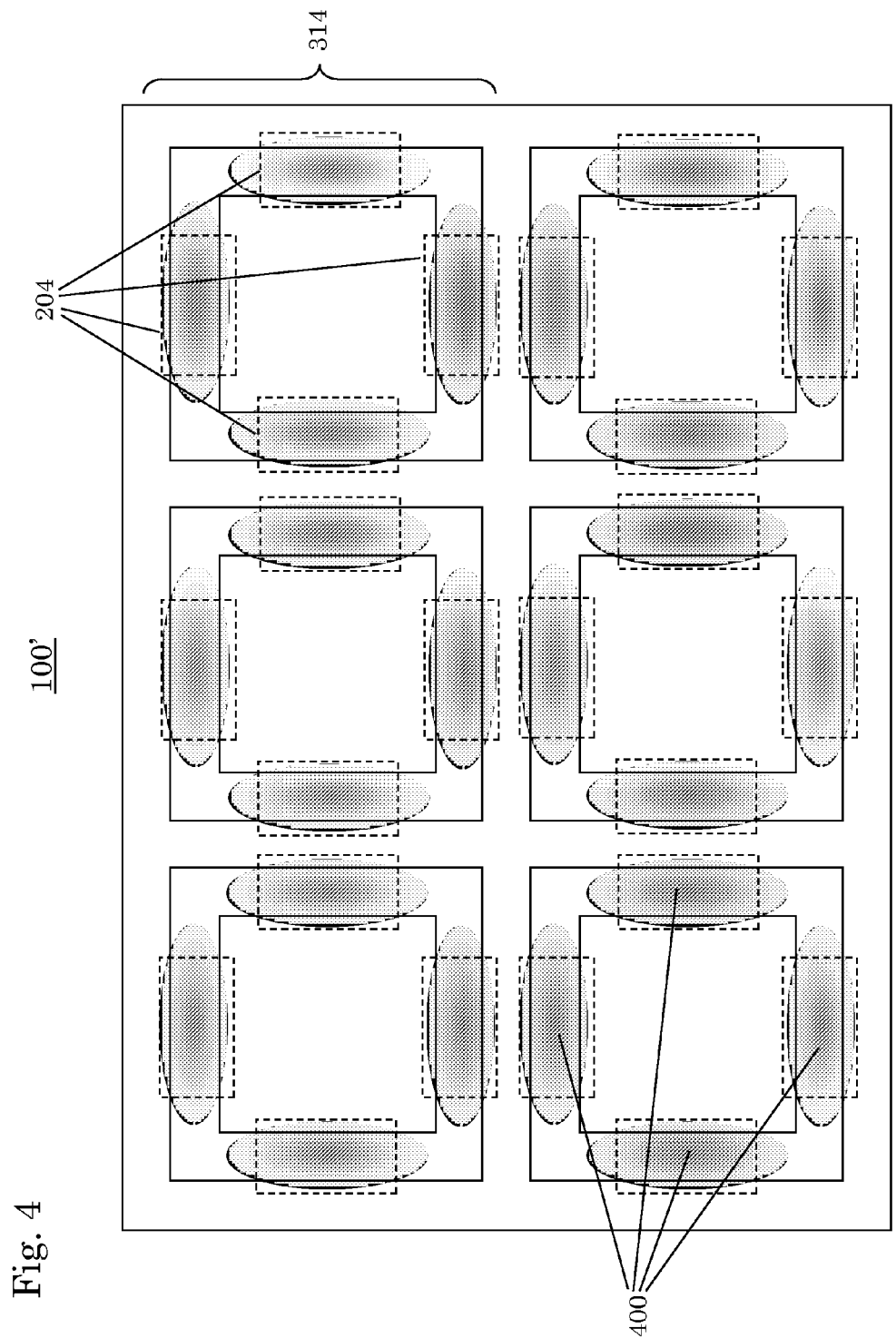
FIG. 4 is a top plan drawing of an exemplary FSS illustrating an exemplary correspondence of resonant surface plasmon wave (SPW) intensity on the exemplary FSS and the placement of via conductors in the exemplary rectenna of FIG. 2.

FIG. 4 illustrates exemplary FSSP structure 100', which includes a 3×2 array of square loop unit cells 314 as shown in FIG. 3C. FIG. 4 also illustrates, as shaded areas 400, regions of peak standing wave intensity for exemplary resonant SPWs propagating on a surface of exemplary FSSP structure 100'. FIG. 4 further illustrates as dashed-line boxes an exemplary positioning of the vias in electrically insulating via layer 202, and thus via conductors 204, of the exemplary frequency selective IR rectenna of FIG. 2.

Using the exemplary positioning of FIG. 4, via conductors 204 may be desirably aligned with the regions of peak standing SPW intensity 400, providing for improved coupling of energy from the SPWs into electrical signals. It is noted that regions of peak standing SPW intensity 400 may be out of phase with respect to each other. However, in the case where FSSP structure 100 and via conductors 204 are formed of materials having different work functions, these phase differences do not adversely effect the coupling of energy from the SPWs into electrical signals, owing to the resulting rectification of the electric signal.

Figure 5:
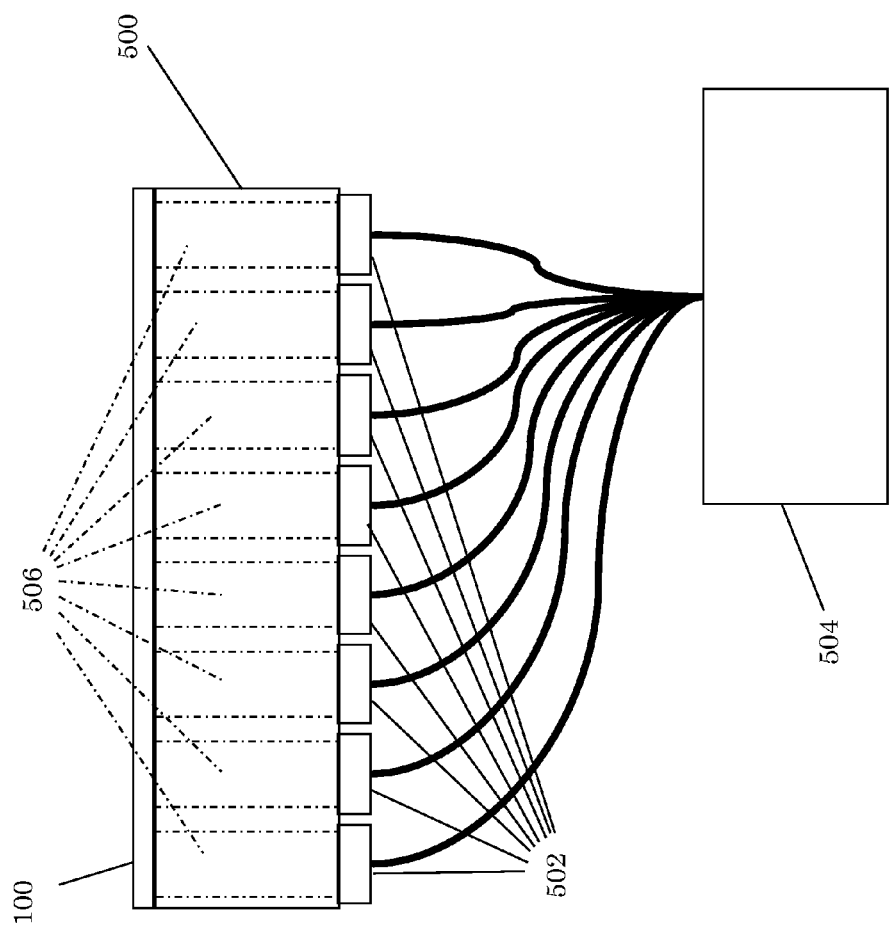
FIG. 5 is a schematic side plan drawing of an exemplary frequency selective IR focal plane array (IRFPA) according to the present invention.

FIGS. 5 and 6 illustrate additional exemplary embodiments of the present invention, a pair of exemplary frequency selective IR focal plane arrays (IRFPAs), which have predetermined frequency bands.

The exemplary frequency selective IRFPA of FIG. 5 is based on a design similar to the frequency selective IR photodetector of FIG. 1. In addition to dielectric IR absorber 500 and FSSP structure 100, this exemplary frequency selective IRFPA includes, array of electrodes 502, which are arranged on the surface of dielectric IR absorber 500 opposite FSSP structure 100 in an N×M array (where N and MN are positive integers and may be equal), and electrically coupled to image decoding processor 504.

Dielectric IR absorber 500 may be formed of any of the same materials and structures as dielectric IR absorber 102 discussed above with respect to the exemplary embodiment of FIG. 1. Additionally, dielectric IR absorber 500 may be selectively doped to create doping pattern 506 in a plane parallel to the surface on which electrodes 502 are formed.

Optional doping pattern 506 may be used to form an array of pixel elements within dielectric IR absorber 500 corresponding to the N×M array of electrodes 502, which may desirably reduce crosstalk between the pixels of this exemplary frequency selective IRFPA. Each of the resulting pixel elements may be designed to be any one of exemplary structures discussed above with respect to the exemplary embodiment of FIG. 1, i.e.: a bulk photoconductor structure (N-type or P-type); a P-N photodiode structure; a P-I-N photodiode structure; a multiple quantum well detector structure; or other photodetector structure. It is also contemplated that doping pattern 506 may be varied such that there are two, or more, sets of pixel elements, each set of pixel elements having a different bandgap energy.

FSSP structure 100 in the exemplary embodiment of FIG. 5 may desirably be formed as discussed above with respect to FIGS. 1 and 3A-C. Alternatively, FSSP structure 100 may be formed with sections of the PCL, that have different unit cells. In this way, regions of FSSP structure 100 corresponding to different sets of unit cells may have different SPW resonances, thus selectively transmitting IR radiation in different subbands, of the desired frequency band. Generally, in such exemplary multiband FSSP structures it may be desirable for each different set of units cells to maintain the same cell side length and vary one or more of their other dimensions to simplify tiling of the unit cells in the PCL.

It is contemplated that it may be desirable for each electrode 502 of the N×M array of electrodes to correspond to a K×L subarray of unit cells of the PCL (K and L both being positive integers). It may further for be desirable for K and L to be equal (i.e. square subarrays), and possibly to equal 1 (i.e. a direct correspondence between unit cells and pixels). In a particular exemplary embodiment that includes both a multiband FSSP structure and a doping pattern with multiple sets of pixel elements with different bandgaps, it may be desirable to coordinate these groupings to produce an exemplary 'multicolor' IRFPA, and/or exemplary spectrometer.

Image decoding processor 504 is desirably used to generate image data from the electrical signals transmitted by the array of electrodes 502. This is because the signals measured by each electrode 502 in the exemplary frequency selective IRFPAs of FIGS. 5 and 6 represent the intensity of resonant SPWs on the portion of the surface of FSSP structure 100 corresponding to the electrode, not necessarily the intensity of the IR radiation incident on that portion of the FSSP structure's surface. It is, however, possible to decode such data, and given the potential for the use of subwavelength-sized pixels (due to the desired subwavelength dimensions of the PCL unit cells, discussed above with respect to the exemplary embodiment of FIG. 1), exemplary frequency selective IRFPAs according to the present invention may have particularly precise imaging capabilities.

The exemplary frequency selective IRFPA of FIG. 6 is based on a design similar to the frequency selective IR rectenna of FIG. 2. The major differences are: 1) a plurality of electrodes 502, each of which is electrically coupled to an N×M pixel array of via conductors 204 (where N and M are positive integers that may be equal and possibly equal 1); and 2) the inclusion of image decoding processor 504. It is noted that the N×M pixel array of via conductors 204 electrically couple to each of electrodes 502 may correspond to a K×L subarray of unit cells of the PCL (where K and L are positive integers that may be equal and may equal 1).

As discussed above with respect to the exemplary embodiment of FIG. 5, FSSP structure 100 in the exemplary embodiment of FIG. 6 may desirably be formed as discussed above with respect to FIGS. 2 and 3A-C, and additionally, may be a multiband FSSP with sections of the PCL that have different unit cells.

Figure 7A:
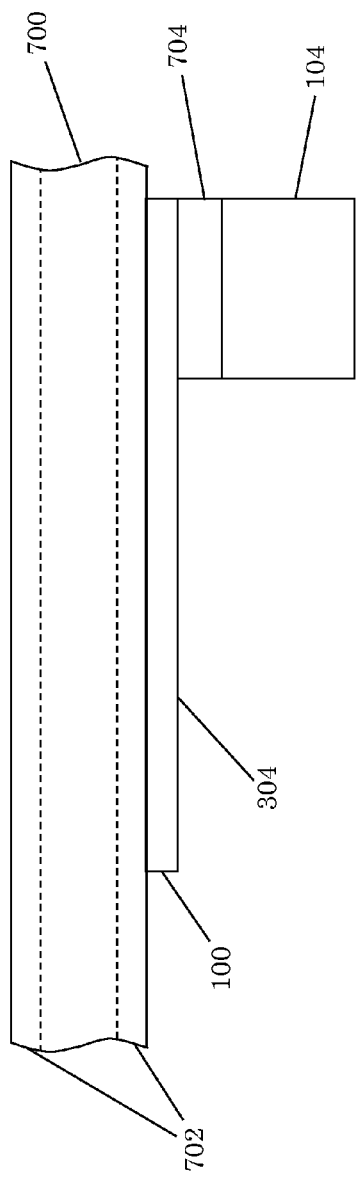
FIGS. 7A and 7B are side plan drawings of exemplary frequency selective IR waveguide sensors according to the present invention.
Figure 7B:
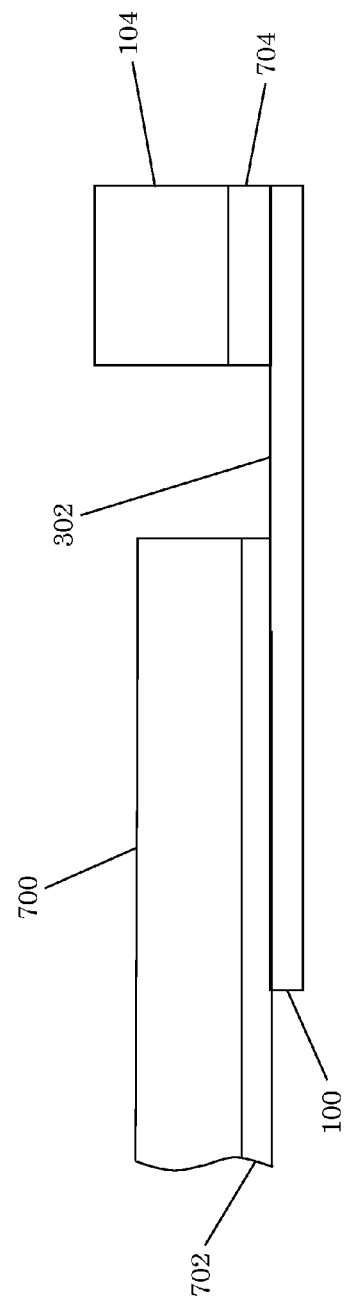

FIGS. 7A and 7B illustrate two exemplary frequency selective IR waveguide sensors, according to the present invention. These frequency selective IR waveguide sensors both have a predetermined frequency hand that may desirably be in the range of about 20 THz to about 400 THz.

Each of these exemplary frequency selective IR waveguide sensors includes: waveguide core 700; cladding layer 702 coupled to the waveguide core; FSSP structure 100 with a transfer portion coupled to the outside surface of cladding layer 702; dielectric thin film layer 704 coupled to a coupling surface of FSSP structure 100; and electrode 104 coupled to dielectric thin film layer 704 opposite from FSSP structure 100.

In exemplary frequency selective IR waveguide sensors an optical signal in the waveguide (i.e. waveguide core 700 and cladding layer 702) is evanescently coupled into SPWs on a surface of FSSP structure 100, and then these SPWs are converted to an electrical signal by dielectric thin film layer 704 and electrode 104.

Dielectric thin film layer 704 may be desirably formed of: an oxide material; an intrinsic semiconductor material; or a doped semiconductor material. Dielectric thin film layer 704 may be a dielectric IR absorber, such as exemplary dielectric IR absorbers 102 discussed above with respected to the exemplary embodiments of FIG. 1, or dielectric thin film layer 704 may be an electrically insulating thin film layer, such as exemplary electrically insulating thin film layer 200 discussed above with respected to the exemplary embodiments of FIG. 2. In either of these cases, it may be desirable for the materials of FSSP structure 100 and electrode 104 to be formed of materials with different work functions to improve conversion of the SPWs into an electrical signal. Additionally, it may be desirable for dielectric thin film layer 704 to be 100 nm or less, or even 10 nm or less, to take advantage of the high electric field strength that may be associated with resonant SPWs on the surface of FSSP structure 100. In the case where dielectric thin film layer 704 is a dielectric IR absorber, a thinner dielectric thin film layer reduces the diffusion time for photocarriers to be swept from dielectric thin film layer 704. In the case where dielectric thin film layer 704 is an electrically insulating thin film layer, a thinner dielectric thin film layer increases the conduction across the resulting M-I-M diode structure.

In FIG. 7A, the waveguide is illustrated as an optical fiber and dielectric thin film layer 704 is coupled to opposite surface 304 of FSSP structure 100. Thus, FIG. 7A illustrates an exemplary frequency selective IR waveguide sensor in which an optical signal in an optical fiber is evanescently coupled into SPWs that propagate on opposite surface 304 of FSSP structure 100. And in FIG. 7B, a planar waveguide is shown and dielectric thin film layer 704 coupled to adjacent surface 302 of FSSP structure 100. Thus, FIG. 7B illustrates an exemplary frequency selective IR waveguide sensor in which an optical signal in a planar waveguide is evanescently coupled into SPWs that propagate on adjacent surface 302 of FSSP structure 100. These embodiments are shown only as examples and are not intended to be limiting. Modification of these exemplary, embodiments to create other combinations of these features (e.g., an exemplary frequency selective IR waveguide sensor in which an optical signal in an optical fiber is evanescently coupled into SPWs that propagate on adjacent surface 302 of FSSP structure 100) will be understood to one skilled in the art.

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed:

1. A frequency selective infrared (IR) photodetector having a predetermined frequency band, the frequency selective photodetector comprising:
    a dielectric IR absorber having a first surface and a second surface substantially parallel to the first surface;
    an electrode electrically coupled to the first surface of the dielectric IR absorber; and
    a frequency selective surface plasmonic (FSSP) structure formed on the second surface of the dielectric IR absorber, the FSSP structure designed to selectively transmit radiation in the predetermined frequency band that is incident on the FSSP structure substantially independent of the angle of incidence of the incident radiation on the FSSP structure.

2. The frequency selective IR photodetector of claim 1, wherein the dielectric IR absorber includes one of:
    a bulk N-type photoconductor structure;
    a bulk P-type photoconductor structure;
    a P-N photodiode structure;
    a P-I-N photodiode structure; or
    a multiple quantum well detector structure.

3. The frequency selective IR photodetector of claim 1, wherein the dielectric IR absorber includes a wavelength selective thin film reflector layer adjacent to the second surface.

4. The frequency selective IR photodetector of claim 1, wherein a thickness of the dielectric IR absorber is approximately $c/4n_{ave}f_{peak}$, where:
    c is the speed of light in vacuum;
    $n_{ave}$ is the average index of refraction of the dielectric IR absorber; and
    $f_{peak}$ is a peak frequency of the predetermined frequency band.

5. The frequency selective IR photodetector of claim 1, wherein the electrode is reflective to radiation in the predetermined frequency band.

6. The frequency selective IR photodetector of claim 1, wherein the FSSP structure includes a patterned conductive layer (PCL) having:
    a design surface plasmon wave (SPW) resonance approximately equal to a highest frequency of the predetermined frequency band;
    a third surface coupled to the second surface of the dielectric IR absorber; and
    a fourth surface substantially parallel to the third surface.

7. The frequency selective IR photodetector of claim 6, wherein the PCL includes a two dimensional array of substantially identical square unit cells, each unit cell having a side length, $l_{unit}$, such that $l_{unit} < c/2nf_{peak}$, where:
    c is the speed of light in vacuum;
    n is the index of refraction of the dielectric IR absorber at the second surface; and
    $f_{peak}$ is a peak frequency of the predetermined frequency band.

8. The frequency selective IR photodetector of claim 7, wherein each unit cell of the PCL includes one of:
    a square loop pattern; or
    a cruciform pattern.

9. The frequency selective IR photodetector of claim 6, wherein the FSSP structure further includes an adhesion layer between the second surface of the dielectric IR absorber and the PCL.

10. The frequency selective IR photodetector of claim 6, wherein the design SPW resonance is for SPWs propagating on one of:
   the third surface of the PCL; or
   the fourth surface of the PCL.

11. The frequency selective IR photodetector of claim 6, wherein the FSSP structure further includes insulating material filling gaps in the PCL.

12. The frequency selective IR photodetector of claim 11, wherein the FSSP structure further includes a wavelength selective thin film reflector layer formed on the fourth surface of the PCL.

13. The frequency selective IR photodetector of claim 6, wherein the PCL is formed of at least one of: gold; aluminum; copper; silver; platinum; titanium; tungsten; a high temperature superconductor; or a metal superconductor.

14. The frequency selective IR photodetector of claim 6, wherein the dielectric IR absorber has a bandgap energy approximately equal to a photon energy of radiation having a lowest frequency of the predetermined frequency band.

15. The frequency selective IR photodetector of claim 1, wherein the predetermined frequency band is in the range of about 20 THz to about 40 THz.

\* \* \* \* \*